(12) United States Patent
Weber, Jr. et al.

(10) Patent No.: US 7,808,128 B1
(45) Date of Patent: Oct. 5, 2010

(54) REMOTE MONITORING OF CONTROL DECISIONS FOR NETWORK PROTECTORS

(75) Inventors: John Robert Weber, Jr., Northport, NY (US); Carl Francis Scheuermann, Stony Brook, NY (US)

(73) Assignee: DGI Creations, LLC, Raleigh, NC (US)

( * ) Notice: Subject to any disclaimer, the term of this patent is extended or adjusted under 35 U.S.C. 154(b) by 0 days.

(21) Appl. No.: 12/404,981

(22) Filed: Mar. 16, 2009

Related U.S. Application Data

(62) Division of application No. 11/272,632, filed on Nov. 14, 2005, now abandoned.

(60) Provisional application No. 60/627,570, filed on Nov. 12, 2004.

(51) Int. Cl.
*H02H 3/00* (2006.01)
*G01R 31/327* (2006.01)

(52) U.S. Cl. ............... 307/127; 455/91; 455/127.1; 361/85

(58) Field of Classification Search ............ 307/127; 455/91, 127.1; 361/85
See application file for complete search history.

(56) References Cited

U.S. PATENT DOCUMENTS

| | | | | |
|---|---|---|---|---|
| 3,405,320 A | 10/1968 | Schwanenflugel | ............ | 317/27 |
| 3,831,061 A | 8/1974 | Boyd | ............ | 317/36 |
| 3,962,547 A | 6/1976 | Pattantyus-Abraham | .... | 179/2.5 |
| 4,065,763 A | 12/1977 | Whyte et al. | ............ | 340/310 |
| 4,293,886 A | 10/1981 | Church et al. | ............ | 361/71 |
| 4,523,307 A | 6/1985 | Brown et al. | ............ | 370/30 |
| 4,538,196 A | 8/1985 | Sun et al. | ............ | 361/64 |
| 4,642,607 A | 2/1987 | Strom et al. | ............ | 340/310 |
| 4,757,416 A | 7/1988 | Wilkerson | ............ | 361/84 |
| 4,845,594 A | 7/1989 | Wilkerson | ............ | 361/71 |
| 4,862,157 A | 8/1989 | Noel | ............ | 340/825 |
| 5,475,558 A * | 12/1995 | Barjonnet et al. | ............ | 361/64 |
| 5,859,596 A * | 1/1999 | McRae | ............ | 340/870.02 |
| 5,892,645 A * | 4/1999 | Watanabe et al. | ............ | 361/85 |
| 6,407,897 B1 * | 6/2002 | Yanniello et al. | ............ | 361/62 |
| 6,407,987 B1 | 6/2002 | Abraham | ............ | 370/295 |
| 6,496,342 B1 * | 12/2002 | Horvath et al. | ............ | 361/65 |
| 6,654,216 B2 * | 11/2003 | Horvath et al. | ............ | 361/65 |
| 6,980,089 B1 | 12/2005 | Kline | ............ | 340/310.01 |
| 7,242,729 B1 | 7/2007 | Heistermann et al. | ....... | 375/329 |
| 7,301,738 B2 * | 11/2007 | Pearlman et al. | ............ | 361/42 |

(Continued)

OTHER PUBLICATIONS

Office Action dated Apr. 15, 2008 for related U.S. Appl. No. 11/272,632, 15 pgs.

(Continued)

*Primary Examiner*—Jared Fureman
*Assistant Examiner*—Adi Amrany
(74) *Attorney, Agent, or Firm*—The Eclipse Group LLP; Kevin E. Flynn

(57) ABSTRACT

Network protectors isolate the secondary side of a transformer from a load distribution network. It is useful to have information about the electrical parameters for the transformer and the load side of an open network protector and it is useful to have access to electrical parameters for a closed network protector. Information about a network protector can be provided to a transmitter used to convey information about the transformer associated with that network protector so that information about the network protector can be sent over power liner carrier to a centralized receiver.

9 Claims, 6 Drawing Sheets

U.S. PATENT DOCUMENTS

| | | | |
|---|---|---|---|
| 7,366,773 B2 | 4/2008 | Weber, Jr. | 709/223 |
| 7,403,015 B2* | 7/2008 | Carlino et al. | 324/424 |
| 7,519,134 B1 | 4/2009 | Heistermann et al. | 375/329 |
| 7,606,298 B1 | 10/2009 | Weber, Jr. et al. | 375/224 |
| 2006/0087783 A1* | 4/2006 | Holley | 361/81 |
| 2006/0165023 A1* | 7/2006 | Faulkner et al. | 370/310 |
| 2007/0249319 A1* | 10/2007 | Faulkner et al. | 455/402 |

OTHER PUBLICATIONS

Office Action dated Oct. 16, 2008 for related U.S. Appl. No. 11/272,632, 10 pgs.

* cited by examiner

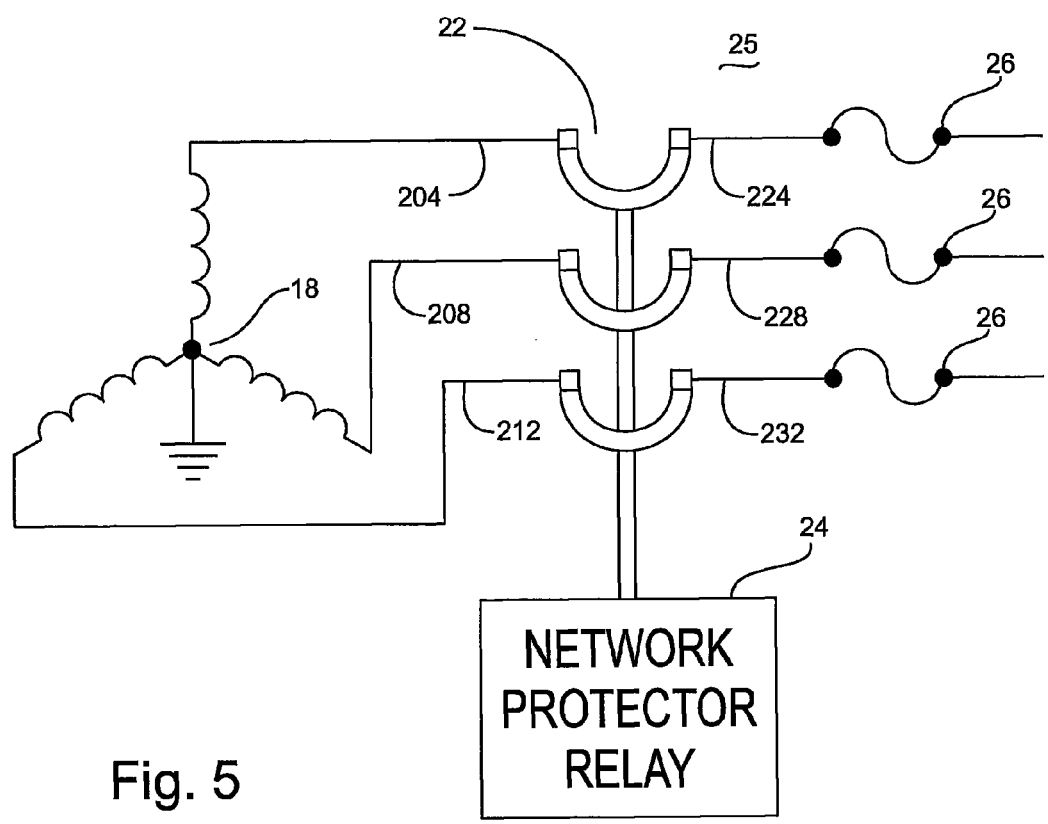
Fig. 5
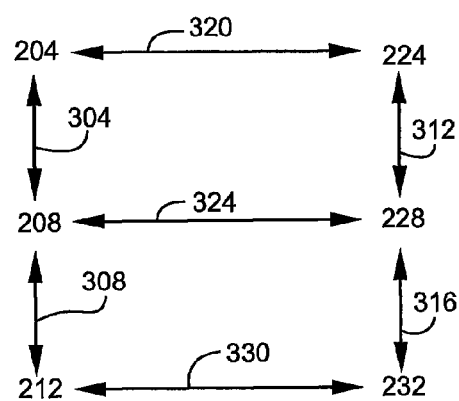

REMOTE MONITORING OF CONTROL DECISIONS FOR NETWORK PROTECTORS

BACKGROUND

1. Field of the Disclosure

This disclosure for apparatus and methods for a data processing computer to receive and process information relevant to testing whether a particular piece of equipment (a network protector) located at a remote location is operating in accordance with a set of control system rules to open and close the network protector. (See for example Class 702, subclasses 183 and 286).

2. Description of the Prior Art & Problems with Prior Art Solutions

The prior art has evolved a series of solutions to address the needs to distribute electrical power. The solutions include the use of low voltage grid or spot networks. FIG. 1 is taken from U.S. Pat. No. 4,293,886 for Network Protector Relay where the components were introduced as follows "A typical application for a network protector relay of the type disclosed herein is shown in FIG. 1. In FIG. 1 a first substation feeder 10 is connected to a primary winding 12 of a first step down transformer 14 through a three phase primary breaker 16. A secondary winding 18 of the transformer 14 is connected to a network bus 20 through a set of main contacts 22 and a first set of fuses 26 of a network protector 25. The operation of the contacts 22 is controlled by a network protector relay 24. Similarly, a second substation feeder 28 is connected to the network bus 20 through a second three phase primary breaker 30, a second step down transformer 32, a set of main contacts 34 of a second network protector 37 whose operation is controlled by a network protector relay 36, and a second set of fuses 38. The network bus 20 supplies power to a load 40. Since network protectors are often located in relatively inaccessible locations, such as in a vault beneath a street, it is desirable that the sets of contacts 22 and 34 controlled by the network protector relays 24 and 36, respectively, automatically connect and disconnect the substation feeders 10 and 28 to the network bus 20."

A complication not shown in FIG. 1 is that the cables shown for the three phases of network bus 20 extend for distances in the range of 1000 feet or more horizontally plus vertical distances with virtually all of this extended bus hidden from view in cable runs. The network bus is apt to have several different transformers connected to the bus as opposed to the two shown here. By feeding network bus 20 with a number of different transformers, customers are provided with uninterrupted power as transformers are added or removed from the network bus 20 to correspond with the variations in power needs or other distribution issues (such as the need to compensate for a disabled component).

One of skill in the art will recognize that the load 40 connected to the network bus 20 is not a single load but rather an aggregation of many loads, possibly from a mix of industrial, commercial and residential customers. Some customers may have electrical service connected to less than all three phases of the network bus 20. The characteristics of the load change over the course of a day as factories close down for the night, as demands for air conditioning change throughout the day, and as residents come home to their residences. The characteristics of the load also shift over time as new equipment is connected at customer locations.

FIG. 2 illustrates another complication not shown in FIG. 1 that the cables that comprise network bus 20 are not continuous cables neatly arranged on transmission towers where they can be seen and visually traced. In urban settings, the combination of high load densities arising from large buildings, with very little space between, leads to locating electrical distribution equipment in underground vaults. In order to connect together various transformers to buses, cables run between vaults underground. In order to provide adequate capacity and redundancy, a multitude of cables run between vaults and the buses are effectively created by connecting together cable segments to form the bus. The relevance of the segments to this application is that the connecting together of segments leads to the risk that during a new construction or a major repair, that a first phase of one transformer may be connected to a bus carrying the second phase of other transformers. This is often called "rolled phases".

Relays such as those referenced or disclosed in U.S. Pat. No. 4,293,886 are adapted to isolate the transformer and the connector feeder from the network bus 20 based on various electrical measurements used as inputs. These relays also restrict the reconnection of the electrical bus to the transformer unless various relationships exist between the voltages found on the feeder and network sides of the network protector.

To illustrate the point, a relay may prohibit reconnection across a network protector unless for each pair 204/224, 208/228, and 212/232 (See FIG. 5), there are:

matching voltage phases (i.e. the interconnect bus has no rolled phases), and the voltage measured on each side of the network protector differs so that power will flow from feeders 10 and 28 (See FIG. 1) to network bus 20 (See FIG. 1) and not vice versa.

While these network protector relays controlled the network protector, the useful information concerning measured conditions on either side of the network protector was not available to monitoring devices that receive information about transformers via power line carrier communication.

As discussed below in connection with FIG. 3, power line carrier is used by some information collection systems to send measurements and other information over a phase of the feeder buses 10 and 28 to a centralized location. At the centralized location, the information is pulled from the appropriate phase of the feeder bus by a coil and provided to a receiver 140 which also receives information about the operation of other distribution transformers. The receiver 140 may receive information from more than one phase of a particular feeder bus and from more than one feeder bus so that information about a range of network transformers (such as 108 and 112) which may be located at different locations and connected to different distribution networks (such as 136) may be aggregated at receiver 140. A co-pending and commonly assigned patent application addresses one way of conveying information over the power line carrier and then decoding the conveyed information. More specifically, U.S. Pat. No. 7,242,729 filed Apr. 25, 2005 for Signal Decoding Method and Apparatus provides one set of solutions for the decoding of information conveyed by power line carrier and is incorporated by reference in its entirety and set forth herein.

The prior art has not recognized the advantages nor provided a solution to obtain and transmit via power line carrier to a central receiver the measurements of the type used by network protector relays to trigger disconnections or allow reconnections of the network protectors 128 and 132. This void in the prior art has made it difficult to discern remotely whether a network protector relay is operating properly.

There are additional benefits available from using independent measurement devices so that the actions of a relay can be judged not only on conformity with a set of control system rules but also based on an independent assessment of at least some of the information provided to the relay.

In urban distribution systems, the distribution transformers are typically located in underground vaults. Because of the high voltage and close quarters, it is potentially dangerous to have operators enter the vault to obtain electrical measurements before or after a change in the state of a network protector. Even if the danger can be reduced sufficiently through protective equipment and special procedures, it is time consuming and inconvenient to dispatch an operator into the vault.

Recognizing the importance of accessing information about the electrical properties on each side of the network protector, at least one utility has gone through the expense of running a set of wires to allow for monitoring of the two sides of the network protector to an access point outside of the vault as indicated in FIG. 2 as 204. Given the number of network protectors in even a small distribution network, it is not desirable to incur the expense to run wiring from both sides of each network protector in a transformer vault to many various local monitoring locations outside of the transformer vaults.

SUMMARY

The present disclosure teaches the use of a communication path between a transmitter conveying information about a transformer via power line carrier to a centralized receiver as a path for communicating information about the network protector used to connect or isolate the secondary of the transformer from a load distribution network. For example, information about the electrical conditions present on both sides of an open network protector can be used to discern if the network protector is open in response to conditions (and thus operating properly) or is open because the network protector has failed.

BRIEF DESCRIPTION OF THE FIGURES

FIG. 5 illustrates the various measurement points across the three phases of the network protector.

DETAILED DESCRIPTION

The present disclosure will now be described more fully hereinafter with reference to the accompanying drawings. The various teachings of this disclosure may, however, be embodied in many different forms and should not be construed as limited to the embodiments set forth herein; rather, these embodiments are provided so that this disclosure will be thorough and complete, and will fully convey the scope of the teachings to those skilled in the art. Like numbers refer to like elements throughout.

This application incorporates by reference U.S. patent application Ser. No. 11/272,632 filed Nov. 14, 2005 for Remote Monitoring of Network Protector Via Power Line Carrier which in turn claims priority and incorporates by reference U.S. Provisional Application No. 60/627,570 filed Nov. 12, 2004 for Remote Monitoring of Network Protector Via Power Line Carrier.

Figure 3:
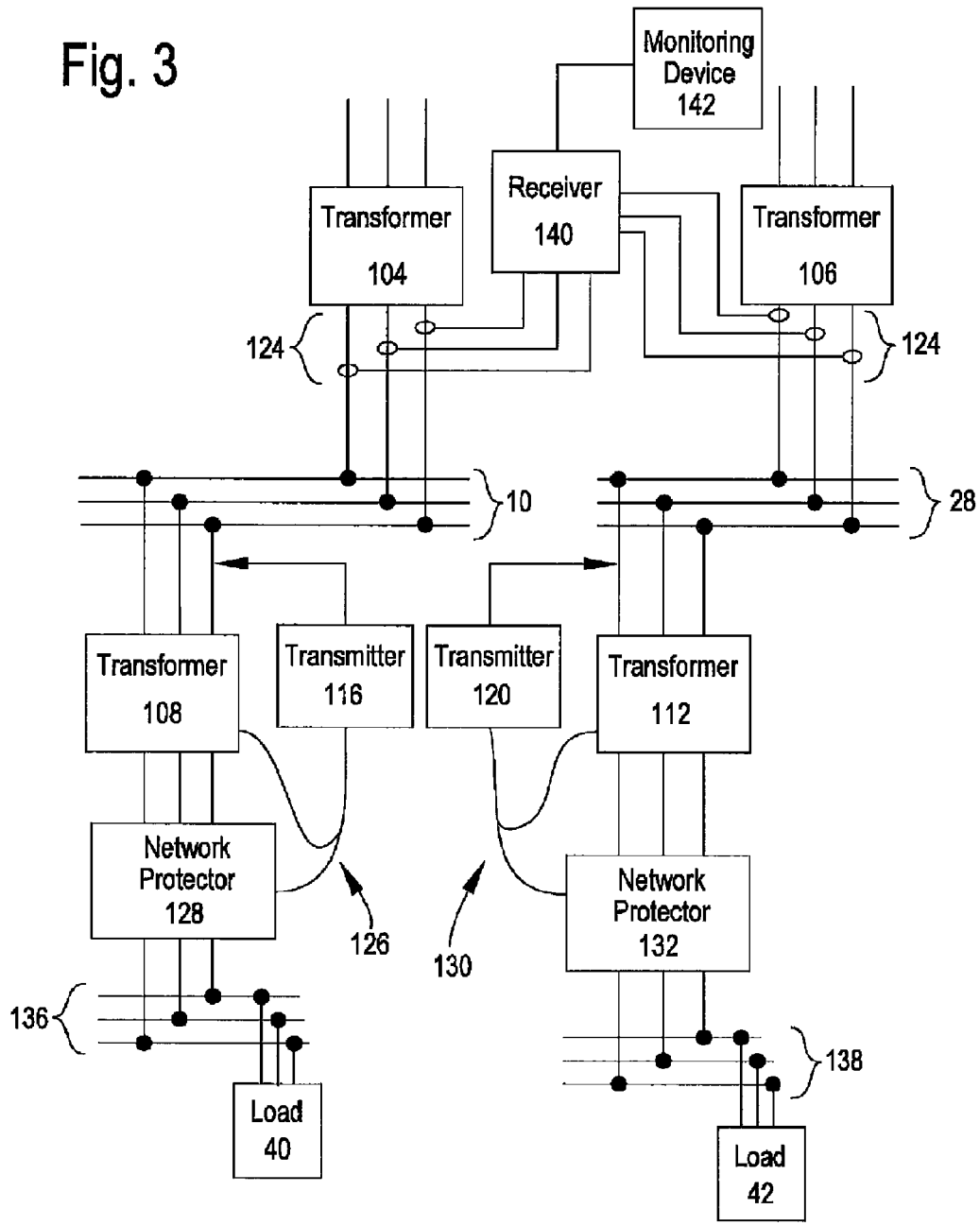
FIG. 3 shows a portion of a distribution network including transformers, network protectors, power line carrier transmitters, and a power line carrier receiver.

FIG. 3 shows the environment of the present disclosure in a simplified drawing in order to introduce certain relevant components. As the focus of this application is on the conveying information about the situation on either side of the network protectors, many relevant components that would be present in an actual power grid distribution system have been omitted. A substation bus transformer such as substation bus transformer 104 or 106 provides three phase power to a feeder bus 10 or feeder bus 28 that in turn provides power to one or more network transformers such as network transformers 108 and 112. As it is useful to monitor certain operating parameters of network transformers 108 and 112 and these network transformers are located a great distance from the substation with substation bus transformers 104 and 106, it is convenient to transmit the information about the remote network transformers 108 and 112 through the use of power line carrier transmitters (116 and 120). The information conveyed by the transmitters is removed from the various legs of the power line near the substation bus transformers 104 and 106 with pick-up coils 124 which pass the relevant signals to a receiver 140 that obtains such information from a number of pick-up coils located within a few hundred feet of the receiver 140. The receiver 140 may receive information from a number of pick-up coils 124 connected to the secondary phases of a variety of substation bus transformers such as substation bus transformer 106 in addition to substation bus 104.

The prior art has developed many solutions to increase the quantity of information conveyed from a transmitter to a receiver 140 including the ability to send information to the receiver on one or more carrier frequencies, frequency division multiplexing. As the carrier used in this particular application is a power line running upstream from a network transformer, carrier frequencies between 40 kHz and 70 kHz are well suited.

The transmitters (116 and 120) receive a series of inputs 126 and 130 regarding the parameters of interest within the network transformers 108 and 112 and parameters of interest with respect to network protectors 128 and 132. Network protectors 128 and 132 protect the network transformers from adverse conditions such as back feed from load distribution networks 136 and 138 into the secondary side of the transformer. While FIG. 3 shows only one network transformer 108 connected through network protector 128 to distribution network 136 to service load 40, in practice several different network transformers, each with their own network protector would be connected to adequately service distribution network 136 and to allow dispatchers some flexibility in connecting and disconnecting network transformers to service a given load 40. Likewise where FIG. 3 shows only one network transformer 112 connected through network protector 132 to distribution network 138 to service load 42, in practice several different network transformers, each with their own network protector would be connected to adequately service distribution network 138 and to allow dispatchers some flexibility in connecting and disconnecting network transformers to service a given load 42.

In order to assess whether an open network protector opened for an appropriate reason or refused to close for an appropriate reason there are times when it is useful to have information on both the transformer side and the load side of the network protector. The present disclosure calls for sending that information from the remote locations of these network transformers 108 and 112 and network protectors 128 and 132 to a receiver 140 at a centralized location that is already being used to monitor the operation of many network transformers.

In one implementation of the teachings of the present disclosure, voltage measurements are taken on each phase on both the load (40, 42) and the transformer side (108 or 112) of the network protector (128 or 132). These voltages are conveyed in a data structure by the transmitter 116 or 120 via power line carrier to a central location. A pick-up coil 124 senses the conveyed information and provides it to a receiver 140 adapted to receive the conveyed information including conversion of DPSK or QPSK coding.

When the network protector (128 or 132) is closed so that the transformer 108 or 112 is connected to the load distribution network 136, the network bus voltage values are conveyed from the transmitter 116 or 120 at the transformer 108 or 112 to a centralized receiver 140 periodically such as every two minutes. As an example, each phase can be checked for voltages that are too high (swell) or too low (sag). Although these alarms can be adjusted, for context consider a 110 volt minimum for a sag alarm with the voltage swell set at 135 volts.

Network protector status (open/closed) is communicated in a data structure sent over power line carrier to the receiver 140.

Prevention of Back Feed.

It is undesirable for current to flow from the distribution network 136 or 138 through the network protector 128 or 132 to the secondary of network transformers 108 or 112. This state called a back feed is characterized by reverse current and should not occur as the network protector 128 or 132 should be opened by the relay before current is flowing through the network protector 128 or 132 into the secondary sides of network transformers 108 or 112.

If information about the network protectors is conveyed to receiver 140 and monitored via monitoring device 142, then the action or inaction of the network protectors can be compared with the rules that are to be implemented by the network protector relay. For example if the network protector 128 or 132 remains open, the correctness of staying open to prevent reverse power flow across the network protector 128 or 132 can be monitored. The presence of a voltage differential across the open network protector (higher on the load side) that would lead to a back feed serves as validation of the action of the relay to open the network protector and keep it open. The ability to see the relevant inputs to the control logic used by the network protector relay allows operators to detect the difference between a network protector operating properly to prevent back feed and a network protector that is failing to close.

Additionally, it is useful to know the voltage on the various load side phases over time whether the network protector is open or closed as the individual phases ultimately support different loads as residential distribution does not provide all three phases to each residence. The ability to monitor voltage on the load side over time can be useful information to discern that the measured voltage on a particular bus or particular phase on a bus is chronically low. Chronically low voltage indicates that additional power may need to be added to support that load—or alternatively that some loads should be reallocated to reduce the load.

Load currents are also measured for all three phases on the distribution network side of the network protector. It is also useful to balance the transformer phases so that no one phase is carrying a significantly higher load than the other phases as this leads to hot spots in the transformer which decreases the useful equipment hours for the transformer.

In a second implementation of the teachings of the present disclosure, in addition to transmitting the voltage levels on either side of the network protector, the current on each phase is measured via a current transformer on the respective bus bar. Examination of the voltage waveform and current waveform gives power factor.

Figure 4:
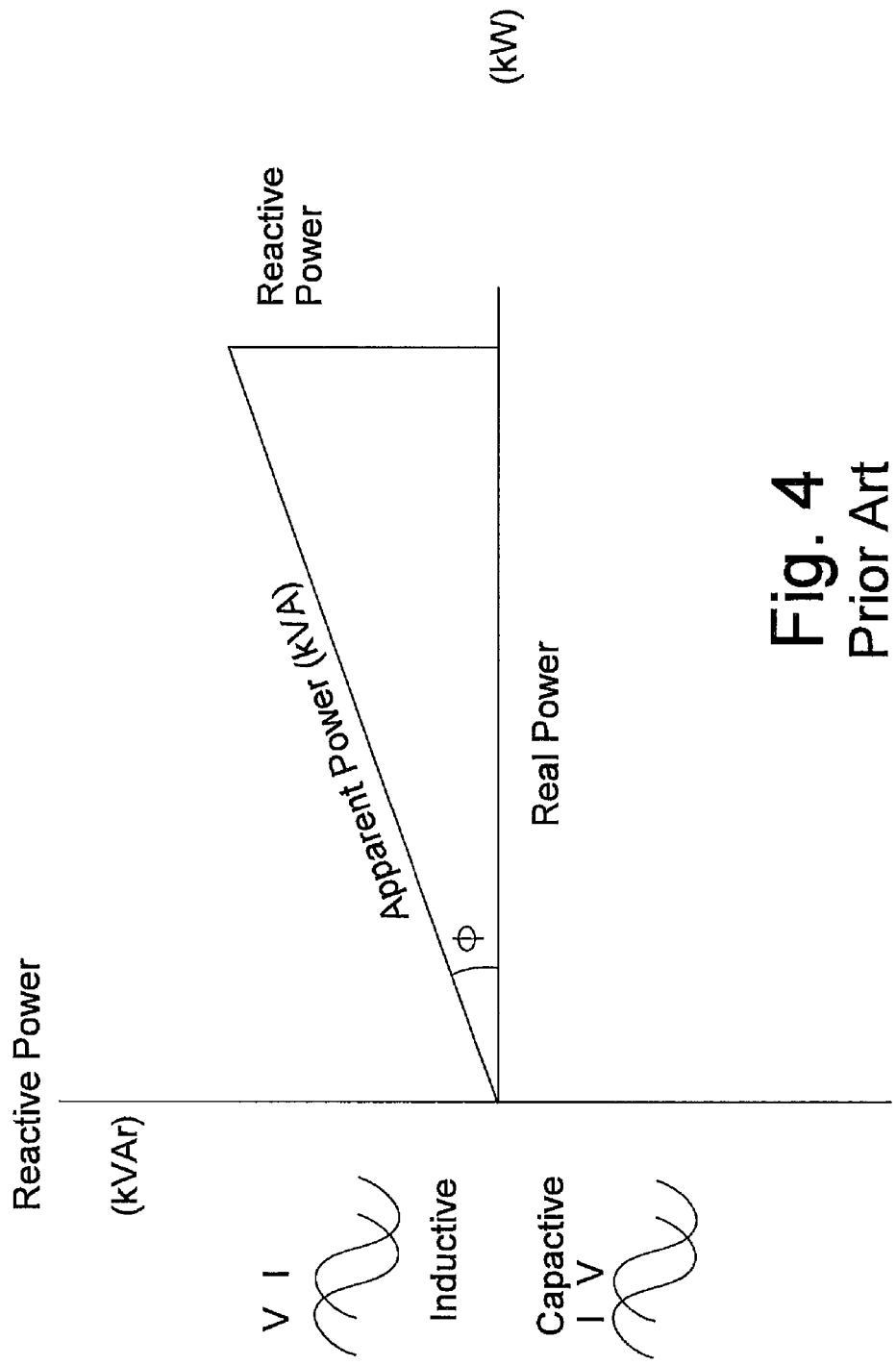
FIG. 4 sets forth concepts of power factor, real, reactive, and apparent power and related concepts as known in the prior art.

As shown in FIG. 4, power factor is a reflection of the difference between apparent power (kVA) provided by the power company and the real power in watts. Real power is often said to be the capacity for performing work. The difference between apparent power and real power is zero for a purely resistive load or in the event that the capacitive load matches the inductive load. However, if the load is inductive, the voltage and current waveforms separate so that voltage leads current. Conversely in the event of a capacitive load, the current waveform leads the voltage waveform. Whenever the inductive and capacitive loads are unbalanced some energy is used for reactive power. The energy provided by the power company to supply the reactive power component (kilo Volts Amps reactive or simply kVArs) represents an inefficiency in the distribution system, as kVArs do not do any work. As with any right triangle, apparent power equals the square root of (the sum of the square of real power plus the square of reactive power). One way to think about power factor is the ratio of real power to apparent power. The lower the power factor the less efficient the system.

Due to the large inductive loads from industrial motors, power companies have added special shunt capacitors to allow power companies to offset some of the inductive load with a capacitive load. Thus, in the context of transformers feeding residential loads, the power companies want to know the presently existing power factor in order to assess if shunt capacitors should be added or removed from the network.

Measuring and Transmitting Power Factor.

A preferred implementation of the teachings of the present disclosure measures apparent power kVA and power factor. Apparent power is obtained by taking rapid successive measurements to create integrals of the voltage and current waveforms. Multiplying these two integrals together gives a kVA number that includes the 50 or 60 Hz sinusoid and the various harmonics. A less precise apparent power can be obtained through the use of a peak detector and the sinusoidal correction of 0.707. These less precise RMS values are approximations and do not account for the impact of the various harmonic content.

As noted above, power factor can be discerned through comparison of the phase angles of the voltage and current waveforms.

Historically, power companies approximated the power factor through use of an estimated efficiency factor and thus an estimated loss associated with power factor. Providing contemporaneous power factor numbers in the data structure sent by power line carrier to the receiver allows the power companies to have more representative power factor numbers for tuning computer modeling that includes losses associated with power factors.

As power factor is based on the difference between inductive and capacitive loading, many factors including the addition of large motors, or many smaller motors, or the upgrade of fluorescent lighting systems will alter the power factor. Collecting power factors with data routinely sent by power line carrier to a central receiver allows power companies to discern trends in the characteristics of the load as new equipment is added.

Figure 1:
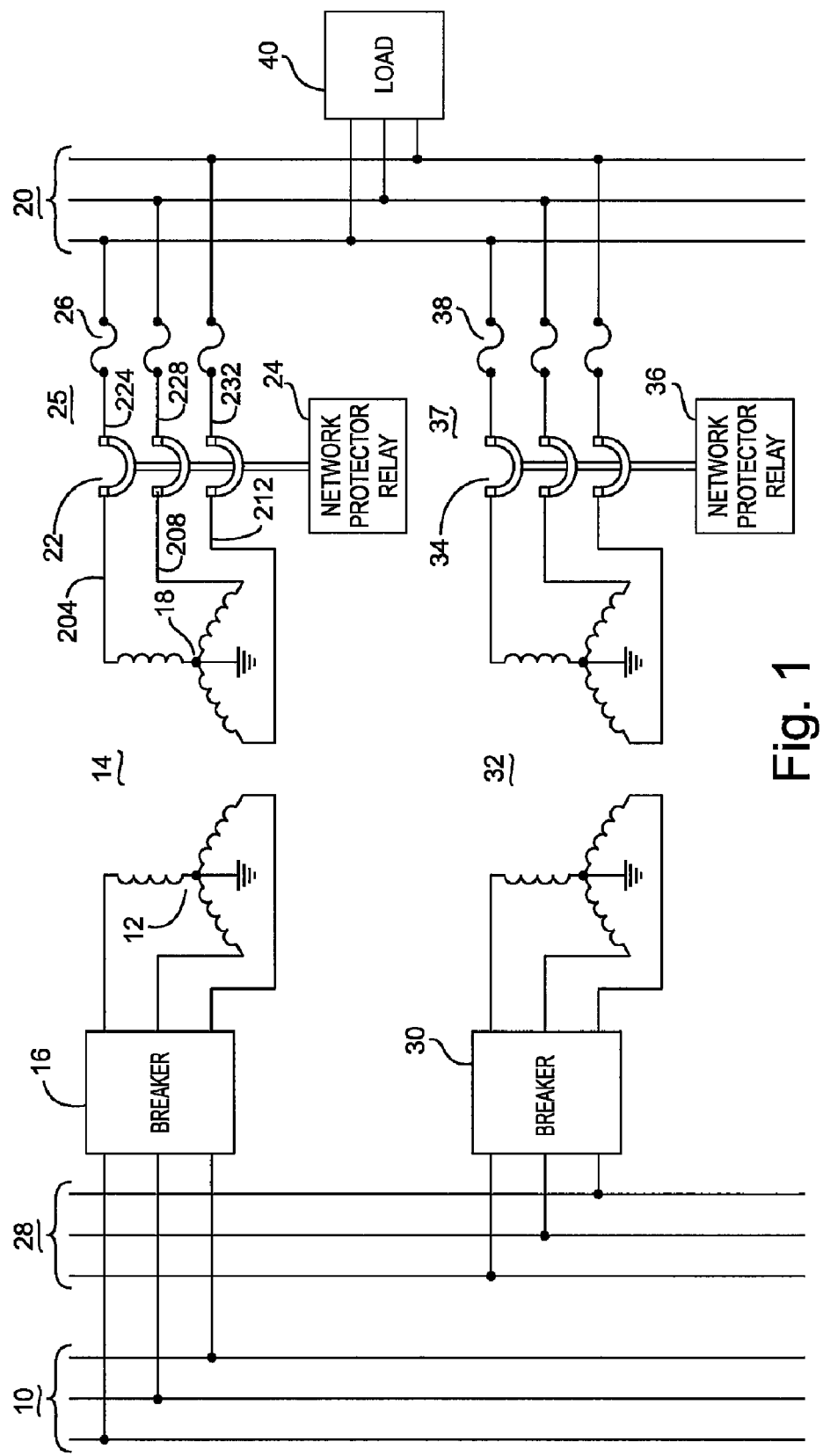
FIG. 1 shows the environment for the disclosure including the placement of relays to actuate network protectors in distribution grids as known in the prior art.
Figure 2:
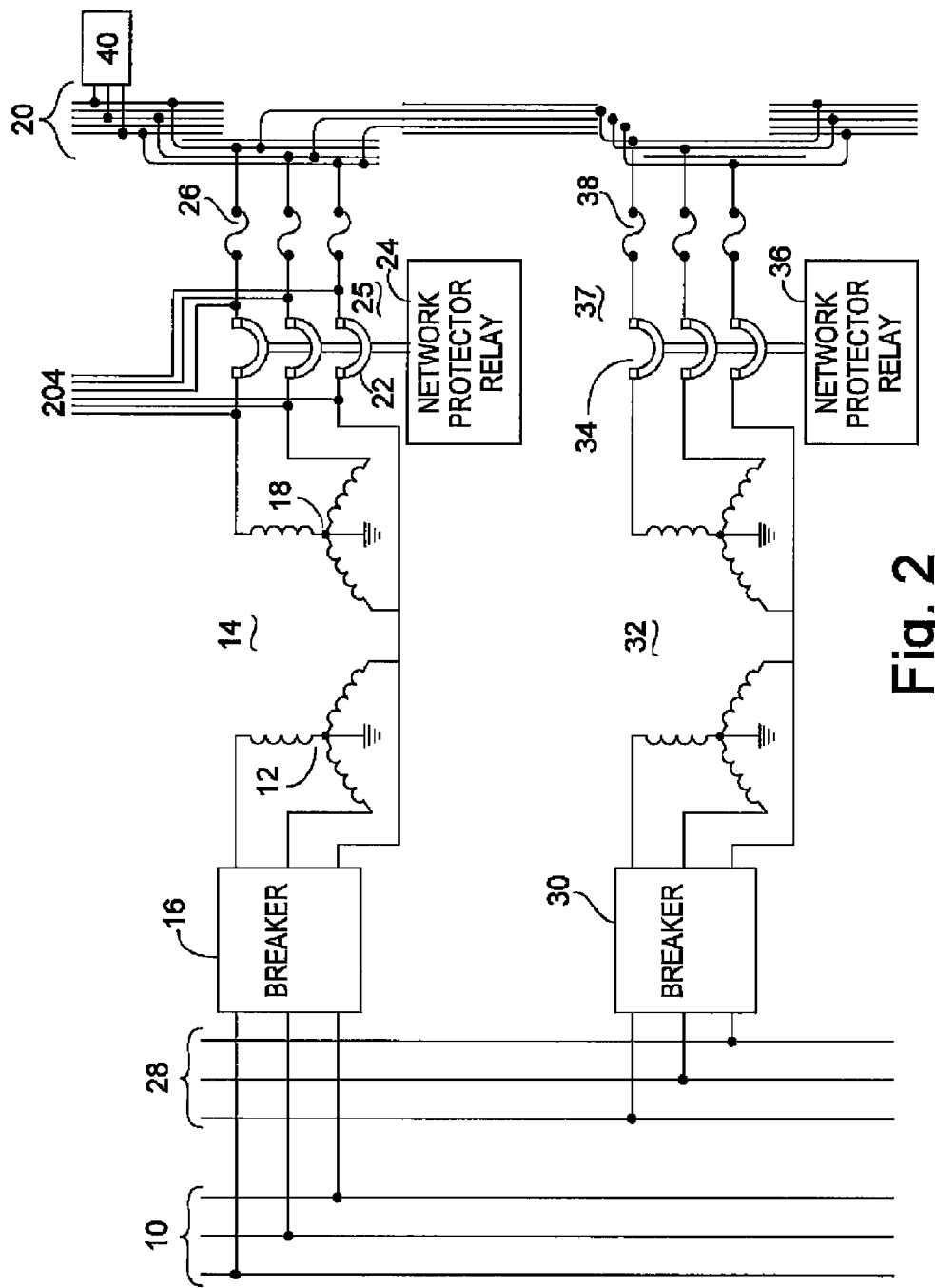
FIG. 2 is a modification of FIG. 1 and illustrates the patchwork nature of the network bus 20 which introduces the real risk that work on the network bus might lead to crossing phases.

Turning now to FIG. 5, a portion of FIG. 1 is reproduced to highlight the various measurement points across the three phases of the network protector. The various connection points are repeated in the lower half of FIG. 5 so that relationship pairings can be labeled.

To check for proper wiring before bringing a transformer back into service a number of different schemes could be used. The following is set forth as an example of one efficient way to reach a high degree of confidence that the wiring is correct.

A comparison 304 of the voltage waveforms between what is thought to be the A and B phases on the transformer side of the network protector should reveal that the A phase is 120 degrees ahead of the B phase. Likewise, a comparison 308 should show the C phase 240 degrees ahead the A phase. On the distribution network side of the network protector, a comparison 312 of the voltage waveforms between what is thought to be A and B phase on the transformer side should reveal that the A phase is 120 degrees ahead of the B phase and a comparison 316 should show the C phase is 120 degrees behind the B phase.

A cross-check is to see that the phases of the voltages measured across comparison 320 are essentially in-phase. Likewise the voltages measured across the open network protector in comparison 324 should be in-phase and the same should be true for comparison 330. If these phase relationships are as expected and the voltage amplitudes are in range and in proper gradient, then the closure of the network protector would appear to be appropriate. Providing this information to a remote monitoring site through use of power line carrier allows the network operators to assess situations and so that inappropriate requests to close the network connector are not made and if they are made, the reasons why the network protector relay did not comply are apparent upon inspection of the transmitted data.

Measuring and Conveying Differential Voltage.

Another useful set of attributes to measure and convey over power line carrier is the differential voltage across an open network protector. One reason why this parameter is useful is that the parameter is used by the network protector. If the voltage measured on a particular phase on either side of an open network protector is not greater than a preset "close voltage" then the network protector will not close. (The voltage should be higher on the transformer side of the network protector). "Failure" of a network protector to close is not a failure of the network protector if the difference in voltage across the open network protector does not exceed the close voltage. Sending a crew to examine a network protector that will not close is not appropriate as the network protector is operating properly.

To provide context, the close voltage is often 1.5 volts for a network protector connected to a 125/216 v bus and is 3.0 volts for a network protector connected to a 277/480 v bus.

Measuring and Conveying Differential Phase Angles.

Yet another set of parameters that are useful to convey over power line carrier to a remote receiver are the differential phase angles across an open network protector. For example if there is a network customer that has equipment for cogeneration of electric power the power on the bus may be out of phase with the corresponding phases on the transformer side of the network protector. The network protector has not failed when it refuses to close and to connect power buses not operating substantially in-phase with the transformer.

Conveying Other Information about Network Protectors.

Once a communication path is established using the teachings of the present disclosure to communicate information about the network protector via a power line carrier to a remote receiver, it can be advantageous to communicate additional information about the operation or environment of the network protector such as the operating temperature of the network protector. Other parameters that may be useful to convey include a) kW load, the total kilowatts (real power) consumed by the load as calculated based upon the power factor and the kVA load; and b) kVAr load, the kilovolt-amperes reactive (reactive power) drawn by the load.

One of skill in the art will recognize that the relationships between real power, apparent power, reactive power, and the angle by which the voltage leads or lags behind the current are related as they form a right triangle so that conveying any two would allow for the calculation of the other two. As the power factor is the cosine of the lead/lag angle, it is an alternative representation of the lead/lag angle and can be conveyed in lieu of the lead/lag angle.

Review of Method Steps.

Figure 6:
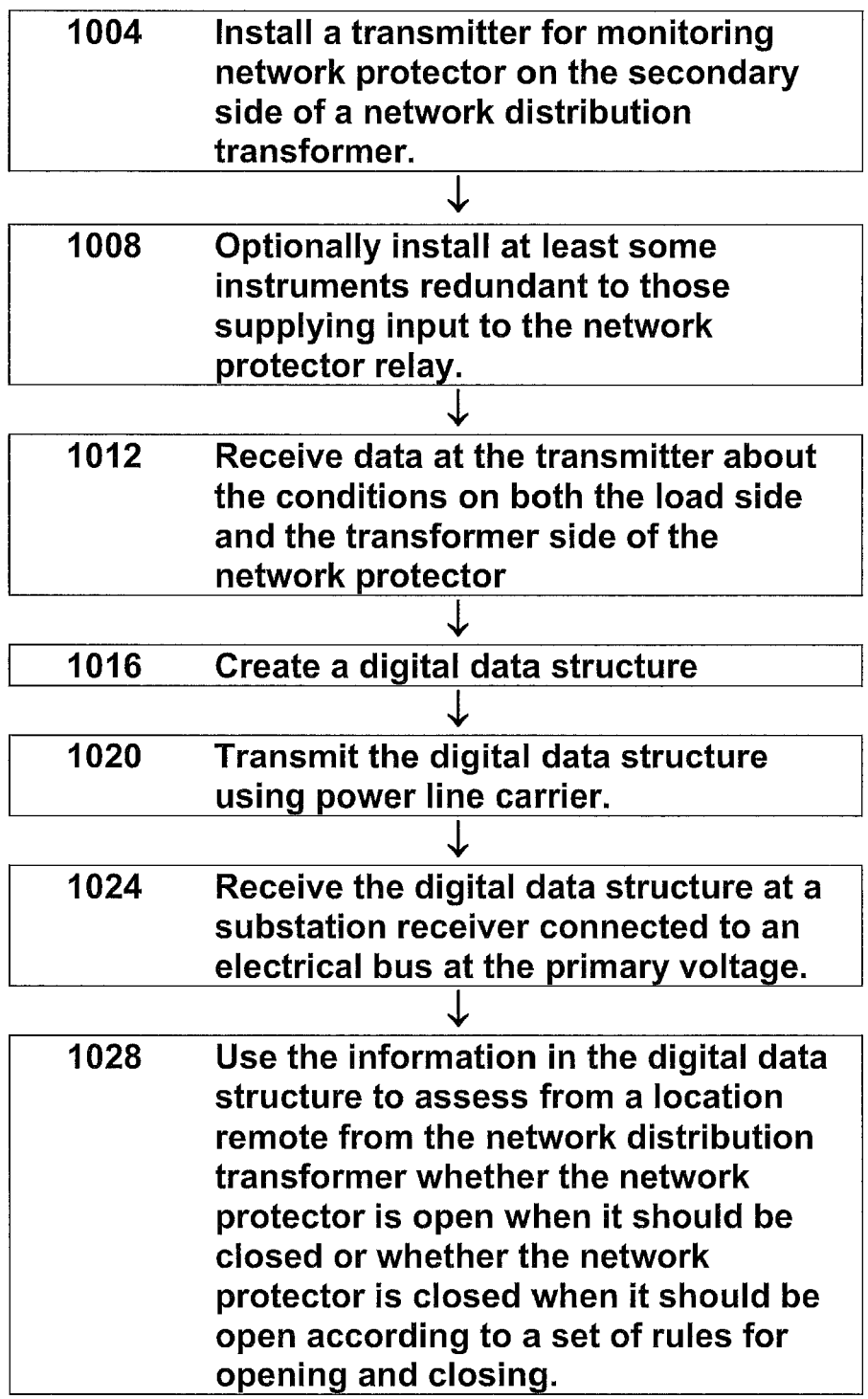
FIG. 6 is a flow chart illustrating a method of assessing a network protector operation from a remote location.

FIG. 6 presents a method 1000 based upon the material set forth above in a way that highlights one way of implementing some of the teachings of the present disclosure. The network protector is located on the secondary side of the network distribution transformer. Transformers of this type step down the voltage of the conveyed electric power from a first range of voltages (the primary side) to a second and lower range of voltages (secondary side). The precise voltage found on each side of the transformer will vary depending upon network conditions but should fall within a prescribed range of voltages.

Step 1004—Install a transmitter for monitoring a network protector on the secondary side of a network distribution transformer. It is likely that this will be the same transmitter used to collect and convey information about the operation of the network distribution transformer via power line carrier. In most instances, a series of network distribution transformers and their associated network protectors will be monitored at one central location.

Step 1008—Optionally, install at least some instruments redundant to those supplying input to the network protector relay. The network protector relay has inputs sufficient for execution of the various rules for opening and closing the network protector breaker. While the present disclosure could be implemented by conveying the information from these instruments to a remote location so that the failure to open or close the network protector breaker could be assessed against operating conditions to check for control failure, the problem may be in the instruments. Therefore, it is beneficial to have at least a partially independent and thus redundant set of measurement instruments.

Step 1012—Receive data at the transmitter about conditions on both the load side and the transformer side of the network protector.

Step 1016—Create digital data structure. The information received at the transmitter is periodically placed in a data structure.

Step 1020—Transmit the digital data structure using power line carrier. As is known in the art, power line carrier may be used to convey digital data over carrier frequencies such as by phase shift keying.

Step 1024—Receive the digital data structure at a substation receiver connected to an electrical bus at the primary voltage.

Step 1028—Use the information in the digital data structure to assess from a location remote from the network distribution transformer whether the network protector is open when it should be closed or closed when it should be open according to a set of rules for opening and closing. Failure of the network protector to react to measured conditions indicates a problem that merits dispatching technicians to correct. The problem could be that an instrument used by the network protector relay but not used for remote monitoring has failed. The problem could be that something is preventing the network protector from changing its open/closed state. The problem could be with the network protector relay.

The method set forth above allows one monitoring device to aggregate information about problematic network protector operation in one place.

The method set forth above allows the person working with the monitoring device to discern that a network protector suspected of malfunction is operating properly such that technicians do not need to travel to the remote network protector to investigate.

The method set forth above allows the person working with the monitoring device to receive an indication that the network protector is not operating in accordance with at least one previously defined rule for operation. Based on this received indication, the person monitoring the operation of the network protectors can dispatch one or more technicians to the remote network protector to repair the equipment.

General Comments

One of skill in the art will recognize that the figures used to illustrate the concepts of the present disclosure included the symbol for a WYE type transformer. Nothing in the present disclosure relies on the use of a WYE type transformer and the invention as captured in the claims that follow should not be so limited.

One of skill in the art will recognize that alternative embodiments set forth above are not universally mutually exclusive and that in some cases alternative embodiments can be created that implement two or more of the variations described above. In a like manner, one of skill in the art will recognize that certain aspects of the present disclosure can be implemented without implementing all of the teachings illustrated in the various disclosed embodiment. Such partial implementations of the teachings of the present disclosure fall within the claimed subject matter unless the claims are explicit in calling for the presence of additional elements from other teachings.

Those skilled in the art will recognize that the methods and apparatus of the present disclosure have many applications and that the disclosure is not limited to the specific examples given to promote understanding of the various teachings. Moreover, the scope of the disclosure covers the range of variations, modifications, and substitutes for the system components described herein, as would be known to those of skill in the art.

The legal limitations of the scope of the claimed invention are set forth in the claims that follow and extend to cover their legal equivalents. Those unfamiliar with the legal tests for equivalency should consult a person registered to practice before the patent authority which granted this patent such as the United States Patent and Trademark Office or its counterpart.

What is claimed is:

1. A method for remotely detecting a failure of a particular network protector within a particular underground vault to act in accordance with a set of rules for opening and closing a network protector circuit breaker, the method comprising:
    installing at least two sets of measurement devices;
        a first set of measurement devices in communication with a local control system for a particular network protector, the local control system used with the set of rules for opening and closing the network protector circuit breaker; and
        a second set of measurement devices not used by the local control system for the particular network protector;
    installing a transmitter for use in conveying information about the particular network protector located within a particular underground vault to a remote receiver;
    receiving at the transmitter, inputs representing conditions on both a load side and a transformer side of the particular network protector for a particular phase of multiphase power on a secondary side of a transformer including measurements from the second set of measurement devices;
    creating a digital data structure containing digital representations of the conditions on both the load side and transformer side of the particular network protector for the particular phase of multiphase power on the secondary side of the transformer;
    transmitting the digital data structure;
    receiving the digital data structure at the remote receiver; and
    using information including measurements from the second set of measurement devices in the digital data structure of the digital representations of the conditions on both the load side and the transformer side of the particular network protector after reception at the remote receiver to assess whether the local control system for the particular network protector is acting in accordance with the set of rules for opening and closing the network protector circuit breaker.

2. The method of claim 1 wherein using information in the digital data structure on the digital representations of the conditions on both the load side and the transformer side of the network protector to assess whether the network protector is acting in accordance with the set of rules for opening and closing the network protector circuit breaker includes using digital representations of the voltage levels on both the load side and the transformer side of the network protector.

3. The method of claim 1 wherein the measurements from the second set of measurement devices include voltage measurements from both the load side and the transformer side of the particular network protector.

4. The method of claim 1 wherein receiving at the transmitter, inputs representing conditions on both a load side and a transformer side of the network protector for a particular phase of multiphase power on a secondary side of the transformer includes digital representations of at least one pair of voltage levels on both the load and transformer side of a network protector for each of three phases of power.

5. The method of claim 1 wherein the digital data structure includes an open/closed status for the current state of the network protector circuit breaker.

6. The method of claim 1 wherein the digital data structure includes at least one value for power factor obtained by discerning a phase difference between a voltage waveform and a current waveform for a particular phase of the multiphase power.

7. The method of claim 1 wherein:
    the digital data structure includes digital representations of a set of voltage waveform phases for each of the three phases of power on both the load side and the transformer side of the network protector; and
    using information in the digital data structure on the digital representations of the conditions on both the load side and the transformer side of the network protector to assess whether the network protector is acting in accordance with the set of rules for opening and closing the network protector circuit breaker includes comparisons of various pairs of voltage waveform phases.

8. The method of claim 1 wherein:

the digital data structure includes digital representations of a set of at least one differential voltage for at least one of the three phases of power conveying the voltage differential from the transformer side to the load side of the network protector; and using information in the digital data structure on the digital representations of the conditions on both the load side and the transformer side of the network protector to assess whether the network protector is acting in accordance with the set of rules for opening and closing the network protector circuit breaker includes comparisons of at least one differential voltage with a minimum close voltage used by a local control system.

9. The method of claim 1 wherein:

the digital data structure includes representations of a set of at least one differential phase angle for at least one of the three phases of power conveying the differential phase angle across the network protector; and using information in the digital data structure on the digital representations of the conditions on both the load side and the transformer side of the network protector to assess whether the network protector is acting in accordance with the set of rules for opening and closing the network protector circuit breaker includes comparisons of at least one differential phase angle with a rule used by a local control system to not close the network protector circuit breaker when the differential phase angle indicates that the conditions across the open network protector circuit breaker are not substantially in-phase.

* * * * *